(12) United States Patent
Jeong

(10) Patent No.: US 8,345,009 B2
(45) Date of Patent: Jan. 1, 2013

(54) INPUT DEVICE USING TOUCH MANNER

(75) Inventor: Shin-Jae Jeong, Jinhae-si (KR)

(73) Assignee: LG Electronics Inc., Seoul (KR)

( * ) Notice: Subject to any disclaimer, the term of this patent is extended or adjusted under 35 U.S.C. 154(b) by 1017 days.

(21) Appl. No.: 12/091,374

(22) PCT Filed: Nov. 13, 2006

(86) PCT No.: PCT/KR2006/004751
§ 371 (c)(1),
(2), (4) Date: Apr. 24, 2008

(87) PCT Pub. No.: WO2007/061195
PCT Pub. Date: May 31, 2007

(65) Prior Publication Data
US 2008/0283309 A1 Nov. 20, 2008

(30) Foreign Application Priority Data
Nov. 22, 2005 (KR) .......... 10-2005-0111801

(51) Int. Cl.
*G06F 3/02* (2006.01)
(52) U.S. Cl. ........................... 345/168; 345/173
(58) Field of Classification Search .......... 345/168–178; 178/18.01–18.11; 700/84; 708/142–146; 710/67; 715/773
See application file for complete search history.

(56) References Cited

U.S. PATENT DOCUMENTS

| | | | | |
|---|---|---|---|---|
| 4,322,831 A * | 3/1982 | Peterson | ...................... | 368/46 |
| 4,460,957 A | 7/1984 | Eggebrecht | | |
| 5,214,785 A * | 5/1993 | Fairweather | ...................... | 710/67 |
| 5,278,958 A * | 1/1994 | Dewa | ............................... | 710/16 |
| 5,448,261 A * | 9/1995 | Koike et al. | .................... | 345/158 |
| 5,875,348 A * | 2/1999 | Matsushima et al. | ............. | 710/4 |
| 5,898,861 A * | 4/1999 | Emerson et al. | ................ | 703/23 |
| 5,959,413 A * | 9/1999 | Komarek et al. | ............. | 315/306 |
| 6,191,709 B1 | 2/2001 | Cho | | |
| 6,396,483 B1 * | 5/2002 | Hiller | ............................ | 345/173 |
| 6,401,156 B1 * | 6/2002 | Mergard et al. | ............... | 710/266 |
| 2003/0193420 A1 | 10/2003 | Wang | | |
| 2003/0197687 A1 * | 10/2003 | Shetter | .......................... | 345/173 |
| 2004/0008129 A1 * | 1/2004 | Philipp | .......................... | 341/22 |

(Continued)

FOREIGN PATENT DOCUMENTS

EP 1 422 601 A1 5/2004
(Continued)

OTHER PUBLICATIONS

Supplemental European Search Report dated Nov. 27, 2008.
(Continued)

*Primary Examiner* — Amare Mengistu
*Assistant Examiner* — Gene W Lee
(74) *Attorney, Agent, or Firm* — Ked & Associates, LLP

(57) ABSTRACT

Provided is an input device using a touch manner. A micro computer and a key control unit perform communications in a serial method to obtain operation stability by reducing the number of data connecting ports between the micro computer and the key control unit. Furthermore, when more than two sets of key matrixes are provided, a plurality of key control unit may be connected to one micro computer to solve interferences between the key patterns. Moreover, operational reliability of the input device using the touch manner is improved by adequately using resources of the key control unit and at the same time reducing processing load of the micro computer.

22 Claims, 3 Drawing Sheets

U.S. PATENT DOCUMENTS

2004/0017362 A1 1/2004 Mulligan et al. .............. 345/173
2006/0183524 A1* 8/2006 Neff ............................... 463/11

FOREIGN PATENT DOCUMENTS

| KR | 10-2002-0019659 A | 3/2002 |
| KR | 10-2004-0108050 A | 12/2004 |

OTHER PUBLICATIONS

Chinese Office Action dated Oct. 28, 2011 for related Chinese Application No. 200680042531.0 (PCT/KR2006/004751) with English translation.
International Search Report dated Jan. 25, 2007.

* cited by examiner

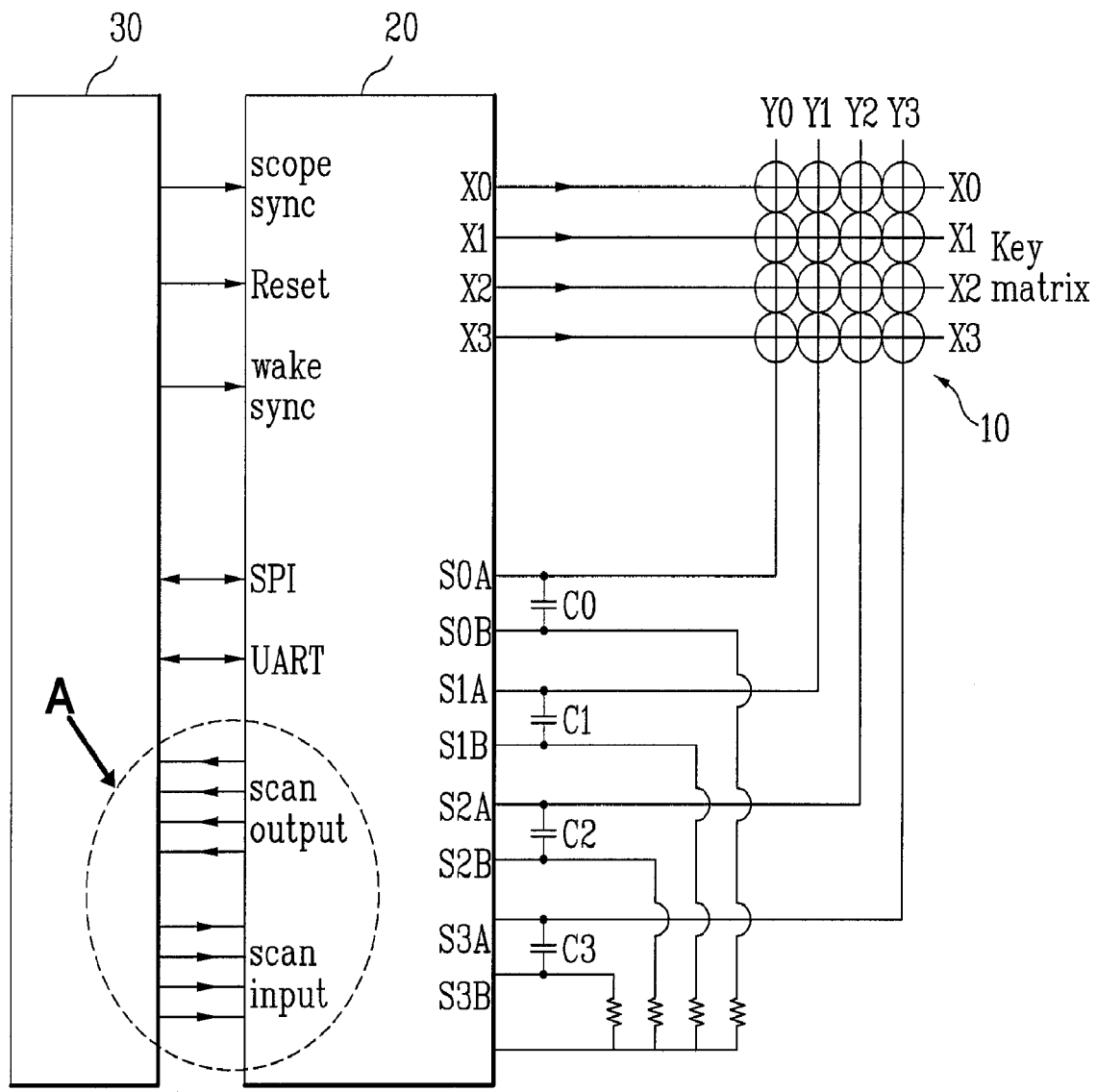
[Fig. 1]

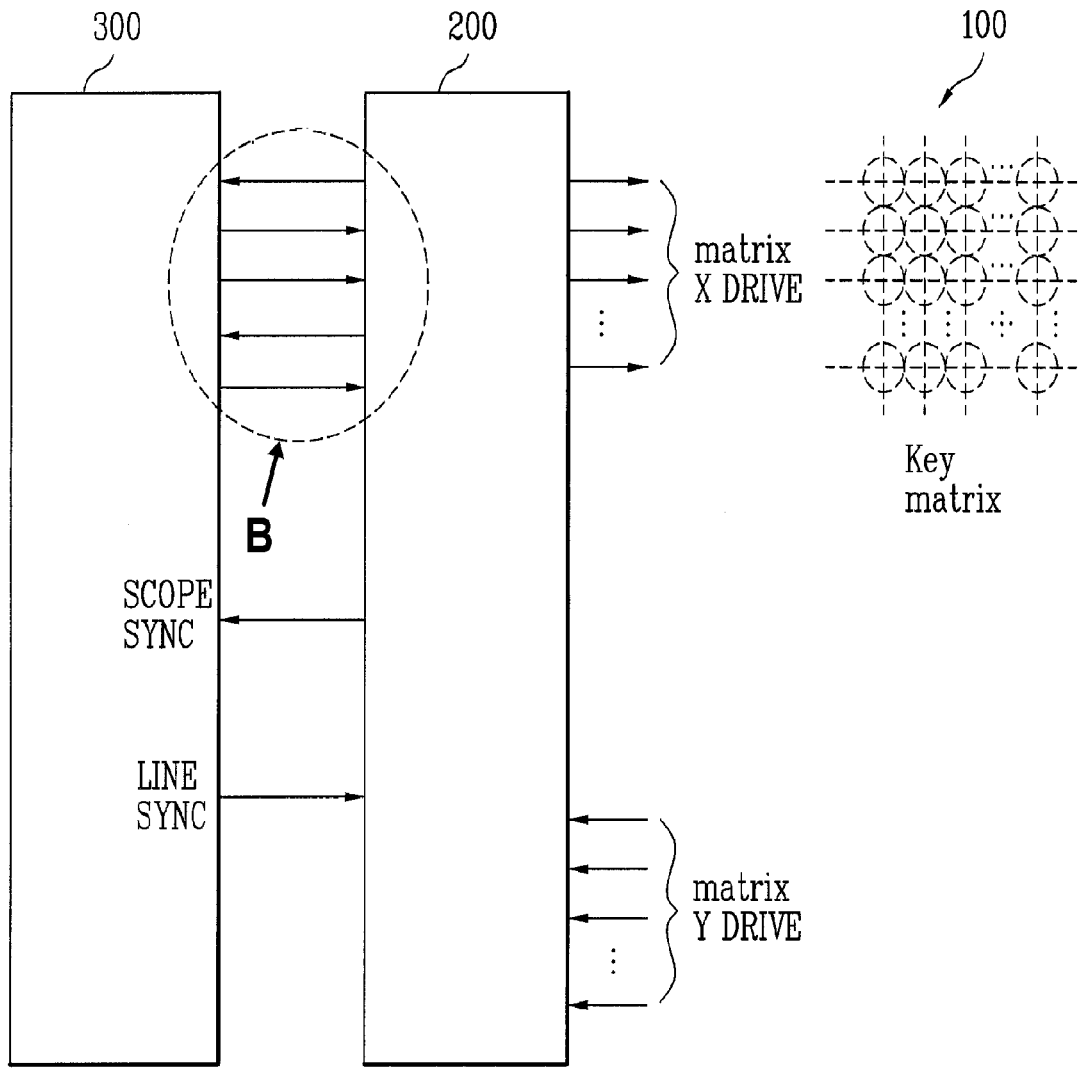
[Fig. 2]
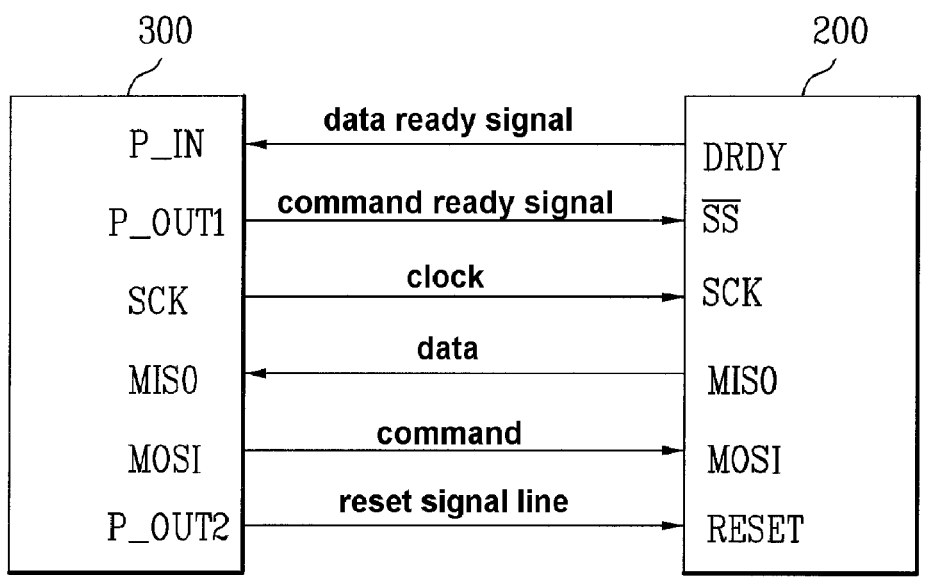
[Fig. 3]

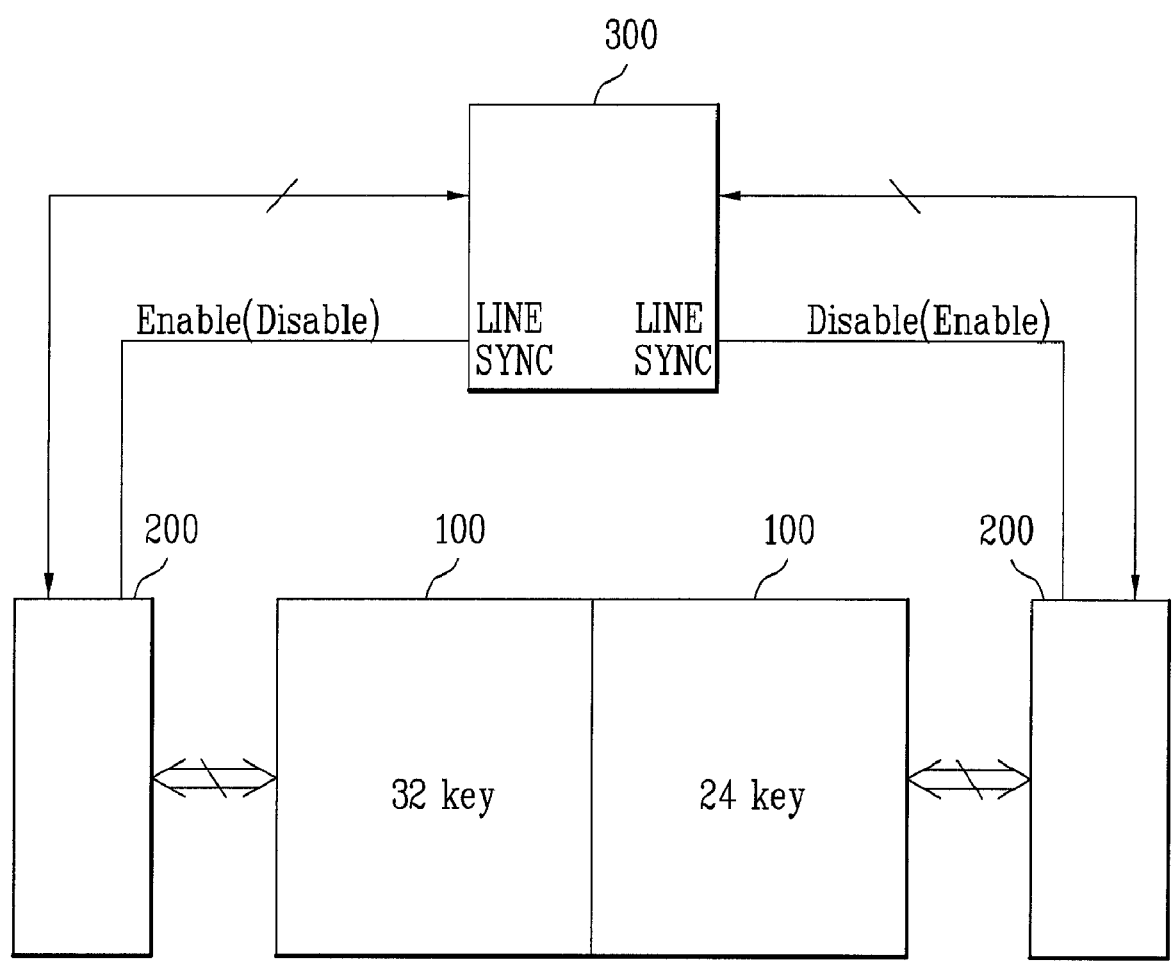

INPUT DEVICE USING TOUCH MANNER

TECHNICAL FIELD

The present invention relates to an input device, and more particularly, to an input device which is operated by a touch method.

BACKGROUND ART

Generally, an input device using a touch screen method, also referred to as a glass touch method, allows a user to selectively touch a certain region of a surface of the input device to input a command. Such input device using the glass touch method has been widely used as a device for inputting commands of users in advanced electric home appliances and electronic goods such as microwave ovens, display screens, and televisions.

As shown in FIG. 1, a well-known input device using the glass touch method includes a key matrix 10 configured with N×N number of glass touch sensors, a key control unit 20 outputting a scan input signal to the key matrix 10 and receiving a scan output signal outputted from the key matrix 10 when a contact of a human body or an object occurs, and a micro computer 30 outputting the scan input signal of the key matrix 10 and receiving the scan output signal of the key matrix 10 by a parallel data communication with the key control unit 20. Herein, the key matrix 10 and the key control unit 20, which is a touch sensor chip, configure a set. The key matrix 10 and the key control unit 20 that processes signals of the key matrix 10 are applied together in order to be applied as an input device in a certain product.

An operation of an input device according to such configuration is as follows.

The micro computer 30 outputs a scan input signal to the key control unit 20 to sense a key signal of the key matrix 10. The key control unit 20 transfers the scan input signal outputted from the micro computer 30 to the key matrix 10 according to its own logic. The logic may be a form of controlling a sequence of input signals.

At this time, when a user touches a certain position of the key matrix 10, capacitance of the glass touch sensor corresponding to the outputted scan input signal section becomes variable and an electrical signal is outputted.

The key signal outputted from the key matrix 10 is transferred into a scan output signal port of the micro computer 30 via the key control unit 20, and the micro computer 30 recognizes the inputted scan output signal as the corresponding key signal.

The micro computer 30 is formed to execute a parallel communication method with the key control unit 20 to recognize the key signal of the key matrix 10. The micro computer 30 is generally required to have a scan input signal port and a scan output signal port with respect to the key matrix 10. In FIG. 1, a region 'A' shows scan input signals and scan output signals being exchanged between the micro computer 30 and the key control unit 20. The region 'A' executes the parallel communication method.

For instance, if the key matrix 10 is configured with 16 keys (4×4), the micro computer 30 requires 4 scan input signal ports and 4 scan output signal ports. That is, the key control unit 20 and the micro computer 30 need a total of 8 data connecting ports connected for inputting and outputting of scan signals.

Recently, more number of keys has been demanded as functions of electric home appliances and electronic goods have become diversified. According to the conventional method, a key matrix demanded by a product has to be constructed from 1, 2, 4, or 16 keys. If 64 keys are demanded, 4 sets of key matrixes configured with 16 keys (4×4) are required. Also, since the micro computer 30 and the key control unit 20 have to be connected in parallel, each set requires 8 data connecting ports, that is, 32 data connecting ports in total. Thus, a micro computer with advanced specification is required and the connection process is difficult. That is, since the micro computer and the key control unit including many data connecting ports are demanded according to the number of keys, product cost is increased and the embodiment of the input device becomes complicated and difficult.

Furthermore, because the glass touch sensor is a key sensor of a capacitance method, a noise may be generated by capacitance interferences between sets while processing key signals when more than two sets of key matrixes are formed. Thus, a key error may be generated.

Moreover, when more than two set of key matrixes are formed, carelessly pressing a key matrix provided at a border portion of the key matrix of a set may cause touching a key pattern at a border portion of another set of key matrix. Thus, interferences may be generated in-between.

Also, as the number of sets of key matrixes is increasing, processing loads of the micro computer increase to result in high chances of errors. Unlike the micro computer, the key control unit has a low efficiency because resources of the key control unit are not adequately used despite the abundance.

DISCLOSURE OF INVENTION

Technical Problem

An object of the present invention is to embody operational stability by reducing the number of data connecting ports between a micro computer and a key control unit.

Another object of the present invention is to overcome interference between key patterns when more than two sets of key matrixes are provided.

A further another object of the present invention is to improve operational reliability of the input device using the touch method by reducing processing loads of a micro computer and at the same time adequately using resources of the key control unit. A still further another object of the present invention is to improve user convenience of the device by using the key control unit to have status data of the key matrix feed backed.

Technical Solution

There is provided an input device using a touch manner, the input device including: a key matrix; a key control unit generating key touch status information of the key matrix including information of touched keys at least from a plurality of keys provided in the key matrix; and a micro computer receiving the key touch status information of the key matrix and controlling the key control unit, the micro computer connected to the key control unit, wherein the micro computer and the key control unit transfer the key touch status information of the key matrix using a serial communication method.

In another aspect of the present invention, there is provided an input device using a touch manner, including: a key matrix; a key control unit determining information of touched keys from a plurality of keys provided in the key matrix; and a micro computer connected to the key control unit and controlling the key control unit, wherein a number of ports connecting the micro computer and the key control unit for transferring touch status information of the key matrix is smaller than a number of the majority of keys provided in the key matrix.

In a further another aspect of the present invention, there is provided an input device using a touch manner, including: a key matrix configured with glass touch sensors in M×N arrangement; a key control unit recognizing a key signal of the key matrix according to an internal logic and determining a status of the key matrix; and a micro computer performing a data communication with the key control unit to receive a key signal and a status information of the key matrix, controlling system operations according to the inputted key signal, and controlling the key control unit according to the status information of the key matrix.

Advantageous Effects

According to embodiments of the present invention, the number of data connecting ports between a micro computer and data connecting ports decreases. Thus, a micro computer of low cost can be used to embody a key matrix, and a connection process becomes easier. Such advantages become conspicuous when there are a large number of patterns of key matrixes.

Furthermore, even when more than two sets of key matrixes are provided, interferences between key buttons provided at a border portion of each set are removed.

Also, since status data of the key matrix can be feed backed to the microcomputer, a user convenience can be naturally improved.

BRIEF DESCRIPTION OF THE DRAWINGS

FIG. 1 illustrates a diagram of an input device using a glass touch method in accordance with a conventional method;

FIG. 2 illustrates a diagram of an input device using a glass touch method in accordance with an embodiment of the present invention;

FIG. 3 illustrates a diagram showing communication lines between a key control unit and a micro computer shown in FIG. 2; and FIG. 4 illustrates a diagram of an input device configured with more than two key matrixes in accordance with an embodiment of the present invention.

DETAILED DESCRIPTION

Reference will now be made in detail to the preferred embodiments of the present invention, examples of which are illustrated in the accompanying drawings. The present invention should not be construed as being limited to the embodiments set forth herein. Although it is apparent to those skilled in the art that various modifications and variations can be made in the present invention, the present invention covers the modifications and variations of this invention provided they come within the scope of the appended claims and their equivalents.

An input device using a glass touch method in accordance with an embodiment of the present invention is described as follows referring to FIGS. 2 and 3.

Referring to FIG. 2, an input device in accordance with the present invention includes a key matrix 100 configured with glass touch sensors in M×N arrangement, a key control unit 200 recognizing key signals of the key matrix 100 and determining status of the key matrix 100 according to an internal logic, and a micro computer 300 receiving the key signals and the status data of the key matrix 100 from the key control unit 200 and controlling system operations according to the inputted key signals, as well as controlling the key control unit 200 according to the status data of the key matrix 100. The key control unit 200 and the micro computer 300 execute communication to each other using a serial communication method to transfer data between the key control unit 200 and the micro computer 300. In FIG. 2, a 'B' region represents a portion where communication is performed in the serial method. The 'B' region is magnified and shown in FIG. 3.

In detail, the key control unit 200 is a touch sensor chip for performing signal processing with respect to the key matrix 100. Herein, a touch sensor chip ship capable of serial data communication with the micro computer 300 is applied. Such key control unit 200 recognizes the key signals of the key matrix 100 using the internal logic in response to a command of the micro computer 300. Furthermore, the key control unit 200 recognizes error status of the key matrix 100 and feed backs to the micro computer 300.

As shown in FIG. 3, the micro computer 300 includes a first input port P_IN for receiving data ready signals from the key control unit 200, a second input port MISO for receiving the key signals and status data of the key matrix 100 from the key control unit 200, a first output port P_OUT1 for outputting command ready signals to the key control unit 200, a second output port MOSI for outputting various commands to the key control unit 200 with respect to the key matrix 100, and a clock output port SCK for outputting various clock signals with respect to the key control unit 200.

That is, the number of input ports and output ports is not related to the number of keys configuring the key matrix 100. The minimum of 5 input ports and output ports between the micro computer 300 and the key control unit 200 allow signal processing with respect to the key matrix 100. It can be easily guessed that this result is derived from executing communication in the serial method between the micro computer and the key control unit. Thus, interferences between adjacent data lines become decreased, improving reliability of communication.

Furthermore, the micro computer 300 further includes a third output port P_OUT2 to utilize as a forceful reset signal line for minimizing communication errors with the key control unit 200. For instance, by outputting a forceful reset signal from the micro computer 300 to the key control unit 200 at a regular interval via the third output port P_OUT2, the communication status can be initialized at a regular interval to minimize the communication errors with the key control unit 200.

Meanwhile, an input device using a glass touch method with more than two key matrix sets are used is illustrated in FIG. 4.

Referring to FIG. 4, two key matrixes 100, two key control units 200, and one micro computer are provided. When an input device is embodied with two or more sets, one key control unit 200 can be processed to become enabled and the other key control unit 200 can be processed to become disabled when processing a signal of the key matrix 100, such that, a noise effect between adjacent key control units 200 may be minimized. That is, when an input device is embodied using two or more key matrixes 100, a sync port LINE SYNC of the micro computer 300 may be used to alternately operate different key control units 200. In this case, an operation signal, i.e., an enable signal or a disable signal, is selectively outputted to the key control unit 200 through the sync port LINE SYNC. Naturally, the micro computer 300 and the key control units 200 execute the serial communication in this case.

It is possible to embody the key control unit 200 to alternately become enabled or disabled using an external interrupt signal supplied from the micro computer 300. Thus, while processing a key signal with respect to one key matrix 100, a disable signal is supplied through the sync port LINE SYNC in the other key matrix. Thus, interferences between key patterns can be minimized.

Meanwhile, by reducing the number of data connecting ports of the micro computer 300 through providing the key control unit 200 performing the serial communication, the input device can be embodied without being restricted by the number of keys of the key matrix 100. Thus, if a product requires 56 keys, only a minimum of 5 ports are required because the 56 keys can be embodied as one pattern.

However, if the number of keys is too large, the 56 keys may be divided into a first key pattern including 24 keys and a second key pattern including 32 keys as illustrated in FIG. 4, considering signal processing speed and processing loads of the key control unit 200. Consequently, if the number of keys increases excessively, the embodiment shown in FIG. 4 may be applied. Even in the cases where the number of key matrixes and key control units are increased, the number of ports performing serial communication between the micro computer and the key control units requires a minimum of 10. Thus, there is only a small chance of generating a noise of a signal.

In this embodiment of the present invention, data which can be communicated between the micro computer 300 and the key control unit 200 include key signals of the key matrix 100, status information including general and error status, a forceful calculation of key signals for each key, and forceful reset signals.

The input device using the glass touch method configured as above is described in more detail in accordance with an embodiment of the present invention.

The micro computer 300 outputs a command ready signal through the first output port P_OUT 1 in order to attempt a communication with the key control unit 200. At this time, the key control unit 200 feedbacks a data ready signal showing a status capable of communication to the first input port P_IN of the micro computer 300 in response to the command ready signal of the micro computer 300.

Then, the micro computer 300 transfers commands demanding key signals of the key matrix 100 through the second output port MOSI at a regular interval in order to recognize key selection of a user through the key matrix 100.

The key control unit 200 outputs a scan input signal to the key matrix 100 according to the command of the micro computer 300, and receives a scan output signal corresponding to the scan input signal from the key matrix 100. In more detail, when the user touches any key of the key matrix 100, capacitance of the key during the scan input signal section becomes variable, and the scan output signal including the corresponding key signal is outputted.

At this time, the key control unit 200 receives the scan output signal outputted from the key matrix 100 and recognizes the certain key signal of the key matrix 100 to transfer to the second input port MISO of the micro computer 300. Accordingly, the key signal of the key matrix 100 can be recognized through the serial data communications between the key control unit 200 and the micro computer 300.

According to such method, the key control unit 200 receives the key status of the key matrix 100 using the serial method through the same port predetermined between the micro computer 300 and the key control unit 200. Thus, malfunctions caused by a noise which may be generated during a parallel communication method may be reduced.

Meanwhile, when the micro computer 300 transfers a corresponding command to the key control unit 200 through the second output port MOSI in order to recognize the status of the key matrix 100, the key control unit 200 recognizes error status of the key matrix 100 by embodying a logic pre-stored inside the key control unit 200 in response to the command of the micro computer 300. For instance, the error statuses are checked, including if the scan output signal is normally outputted from the key matrix 100 with respect to the scan input signal, if the signal output of the key matrix 100 is delayed, and if more than two key signals are being outputted from the key matrix 100.

When the internal logic for determining the error status of the key matrix 100 is completed, the key control unit 200 transfers the status information of the key matrix 100 to the second input port MISO of the micro computer 300.

Then, the micro computer 300 determines generation of errors in the key matrix 100 from the status information transferred from the key control unit 200. When an error is generated in the key matrix 100, the micro computer 300 demands a key signal of the key matrix 100 once more to the key control unit 200, or demands forceful calibration of the key signal of each key of the key matrix 100.

Therefore, the status information of the key matrix 100 provided from the key control unit 200 can be utilized in determining the cause of product defects. For instance, when a signal with respect to one key is too weak while not being a defect, a critical value for determining key contact can be lowered with respect to the corresponding key such that the weak signal generated through the actual touch of the key is not determined as a defect. Furthermore, since the key control unit 200 can execute various processes itself, such as recognition of key contact which used to be performed in the micro computer 300, the loads on the micro computer 300 may be decreased. Thus, an expensive micro computer is not required. Although processing loads of the key control unit 200 increase, the processing loads can be covered by a processor the key control unit 200 has inside. Thus, expensive components are not required.

Meanwhile, as shown in FIG. 4, when the key matrix 100 and the key control unit 200 are embodied in two sets, the micro computer 300 alternately outputs an enable signal to one key control unit and a disable signal to the other key control unit through the sync port LINE SYNC.

At this time, the key control unit 200 performs signal processing with respect to the key matrix 100 only during an enable signal section outputted from the micro computer 300 and does not perform scan output of the key matrix 100 during a disable signal section. Thus, interferences between the two sets can be minimized because the different key control units 200 are operated alternately. Consequently, a plurality of key matrixes can be designed without considering effects of adjacent key patterns.

When more than two key matrixes 100 and the key control units 200 are provided, the same method can be used. The enable signal is transferred to one key control unit 200 and the disable signal is transferred to the other control unit 200.

In accordance with the embodiment, when operating a key provided at a border portion of a key matrix set, another key provided at a border portion of an adjacent key matrix set is less likely to be pressed. Also, the method of this embodiment includes the micro computer 300 and the key control unit 200 performing the serial communication with each other where each set of the micro computer ports executing communication with the key control unit 200 can be controlled by the sync port LINE SYNC controlling the set of micro computer ports. Thus, actuality with respect to embodiment increases.

It is also possible to perform enable/disable control by a sync port using the parallel communication method instead of the serial communication method. However, in that case of the parallel communication method, the complicated connection between the ports become even further complicated. Thus, not much gain is obtained in many ways.

Meanwhile, in accordance with another embodiment of the present invention, using a less number of micro computer ports than a number of keys provided in a key matrix may allow mutually transferring information such as a key signal of the key matrix between the micro computer and the key control unit. Thus, a micro computer of low cost may be used. It is also possible to embody the concept of this invention in a different method which allots a plurality of key information to one port instead of the serial communication method. However, the serial communication method may be naturally used in order to reduce the number of ports to the minimum.

INDUSTRIAL APPLICABILITY

In accordance with the embodiments of the present invention, the input device using the glass touch method is embodied, which allows reducing the number of data connecting ports between the micro computer and the key matrix, minimizing the interferences between the key matrixes, improving the reliability with respect to the noise, and recognizing and adjusting the error status of the key matrix.

Furthermore, since a micro computer of high costs is not needed, a glass touch controller of lower costs can be embodied.

Moreover, when a plurality of keys are needed, the user convenience is improved because it is less likely to touch a plurality of keys simultaneously.

The invention claimed is:

1. An input device comprising:
    a matrix of keys forming a touch panel, each key corresponding to a different location of a touch screen and a different function or input data;
    a key controller to generate key touch status information of the key matrix including information of touched keys at least from a plurality of keys provided in the key matrix; and
    a controller to receive the key touch status information of the key matrix and controlling the key controller,
    wherein the controller is coupled to the key controller,
    wherein the key touch status information of the key matrix is transferred between the controller and the key controller through a serial communication link,
    wherein the key controller performs a key contact recognition operation to determine existence of a condition for at least one key in the matrix, said condition including at least one of a defective activation of the key or a weak-signal condition generated upon activation of the key in the matrix, and
    wherein the controller sends a forced reset signal to the key controller at predetermined intervals, the forced reset signal to initialize a communication status between the controller and key controller at said predetermined intervals.

2. The input device according to claim 1, wherein the key touch status information of the key matrix is transferred through a number of ports less than a number of keys provided in the key matrix, the ports provided in the controller.

3. The input device according to claim 1, wherein logic is stored inside the key controller, the logic determining error status of the key matrix in response to a command of the controller.

4. The input device according to claim 1, wherein the controller comprises:
    a first input port P_IN receiving a data ready signal from the key controller;
    a second input port MISO receiving a key signal and a status information of the key matrix from the key controller;
    a first output port P_OUT1 outputting a command ready signal to the key controller; and
    a second output port MOSI outputting various commands to the key controller with respect to the key matrix.

5. The input device according to claim 4, wherein the controller comprises a third output port P_OUT2 outputting a forceful reset signal to minimize communication errors with the key controller.

6. The input device according to claim 1, wherein at least two key controllers are coupled to the controller, each key controller to control a respective one of a plurality of key matrixes forming touch panels.

7. The input device according to claim 5, wherein the controller comprises a fourth output port LINE SYNC outputting operation signals such as an enable signal and a disable signal controlling operations of the key controller.

8. The input device according to claim 6, wherein, when one of the key matrixes operates, the key controller operating another one of the key matrixes does not operate.

9. An input device using a touch manner, the input device comprising:
    a matrix of keys forming a touch panel, each key corresponding to a different location of a touch screen and a different function or input data;
    a key controller determining information of touched keys from a plurality of keys provided in the key matrix; and
    a controller coupled connected to the key controller and controlling the key controller,
    wherein a number of ports coupling the controller and the key controller for transferring touch status information of the key matrix therebetween is less than a number of keys in the key matrix,
    wherein the key controller performs a key contact recognition operation to determine existence of a condition for at least one key in the matrix, said condition including at least one of a defective activation of the key or a weak-signal condition generated upon activation of the key in the matrix, and
    wherein the controller sends a forced reset signal to the key controller at predetermined intervals, the forced reset signal to initialize a communication status between the controller and key controller at said predetermined intervals.

10. The input device according to claim 9, wherein the key controller comprises first logic for determining information of the touched keys and second logic for determining error status of the key matrix, pre-stored in the key controller.

11. The input device according to claim 9, wherein the information of the touched keys is transferred between the key controller and controller through a serial communication link.

12. The input device according to claim 9, further comprising:
    a plurality of key matrixes forming a respective number of touch panels; and
    a plurality of key controllers to control corresponding ones of the key matrixes,
    wherein each key controller and corresponding key matrix are operated alternately with remaining ones of the key controllers and key matrixes.

13. An input device using a touch manner, the input device comprising:
- a key matrix configured with glass touch sensors in M×N arrangement;
- a key controller to recognize a key signal of the key matrix and determining a status of the key matrix; and
- a controller to perform data communication with the key controller to receive the key signal and status information of the key matrix, to perform one or more operations according to the inputted key signal, and to control the key controller according to the status information of the key matrix, wherein:
- the key controller performs a key contact recognition operation to determine existence of a condition for at least one key in the matrix, said condition including at least one of a defective activation of the key or a weak-signal condition generated upon activation of the key in the matrix,
- the key controller compares a value of a signal corresponding to the at least one key to a predetermined value and identifies the weak-signal condition based on a result of the comparison,
- the controller sends a forced reset signal to the key controller at predetermined intervals, the forced reset signal to initialize a communication status between the controller and key controller at said predetermined intervals, and
- the controller sends a command to the key controller to perform a forceful calibration of one of the keys when an error is detected during operation of the matrix.

14. The input device according to claim 13, further comprising:
- a plurality of key controllers; and
- a plurality of key matrixes corresponding to a respective number of touch panels,
- wherein each key matrix is controlled by a respective one of the key controllers, and wherein each key controller and corresponding key matrix are operated alternately with remaining ones of the key controllers and key matrixes.

15. The input device according to claim 6, wherein the plurality of key matrixes forming said touch panels are set adjacent to one another relative to a same screen.

16. The input device according to claim 12, wherein the plurality of key matrixes forming said touch panels are set adjacent to one another relative to a same screen.

17. The input device according to claim 14, wherein the plurality of key matrixes forming said touch panels are set adjacent to one another relative to a same screen.

18. An input device comprising:
- a first key matrix;
- a second key matrix;
- a first controller to generate key touch status information of the first and second key matrixes, and
- a second controller to receive the key touch status information of the key matrix and to control the first controller, wherein:
- the first and second key matrixes are included in a same touch panel,
- the first and second key matrixes are operated independently from one another and relate to different functions of the same touch panel,
- the key touch status information for the first and second matrixes is transferred between the first and second controllers through a same serial communication link,
- the first controller performs a key contact recognition operation to determine existence of a condition for a key in at least one of the first or second key matrixes, said condition including at least one of a defective activation of the key or a weak-signal condition generated upon activation of the key in the matrix,
- the first controller compares a value of a signal corresponding to the at least one key to a predetermined value and identifies the weak-signal condition based on a result of the comparison, and
- the second controller sends a forced reset signal to the key controller at predetermined intervals, the forced reset signal to initialize a communication status between the second controller and key controller at said predetermined intervals.

19. The input device of claim 18, wherein the first controller includes:
- a first control circuit to control the first key matrix, and
- a second control circuit to control the second key matrix independently from the first key matrix.

20. The input device according to claim 1, wherein the key controller compares a value of a signal corresponding to the at least one key to a predetermined value and identifies the weak-signal condition based on a result of the comparison.

21. The input device according to claim 1, wherein the controller sends a forced reset signal to the key controller at predetermined intervals, the forced reset signal to initialize a communication status between the controller and key controller at said predetermined intervals.

22. The input device according to claim 1, wherein the controller sends a command to the key controller to perform a forceful calibration of one of the keys when an error is detected during operation of the matrix.

* * * * *